US007642872B2

(12) United States Patent  
Fort et al.

(10) Patent No.: US 7,642,872 B2
(45) Date of Patent: Jan. 5, 2010

(54) LOW COST AND LOW VARIATION OSCILLATOR

(75) Inventors: Jimmy Fort, Aix En Provence (FR); Michel Cuenca, Septemes les Vallons (FR); Daniel Payrard, St. Maximin (FR)

(73) Assignee: Atmel Corporation, San Jose, CA (US)

( * ) Notice: Subject to any disclaimer, the term of this patent is extended or adjusted under 35 U.S.C. 154(b) by 90 days.

(21) Appl. No.: 11/753,262

(22) Filed: May 24, 2007

(65) Prior Publication Data

US 2008/0290955 A1  Nov. 27, 2008

(51) Int. Cl.
*H03K 3/02* (2006.01)
*H03K 3/03* (2006.01)
(52) U.S. Cl. .......................... 331/111; 331/57; 331/143
(58) Field of Classification Search .............. 331/57, 331/111, 143, 135; 327/182
See application file for complete search history.

(56) References Cited

U.S. PATENT DOCUMENTS

| 4,785,262 | A | * | 11/1988 | Ryu et al. ................... 331/111 |
| 5,570,067 | A | * | 10/1996 | Shacter ....................... 331/111 |
| 6,060,922 | A | * | 5/2000 | Chow et al. .................. 327/175 |
| 6,353,368 | B1 | | 3/2002 | Iravani |

FOREIGN PATENT DOCUMENTS

| DE | 4340924 | | 6/1995 |
| DE | 102005043376 | A1 | 3/2007 |
| EP | 1693960 | A1 | 8/2006 |
| JP | 2006222524 | A2 | 8/2006 |
| WO | WO-2008153777 | A3 | 12/2008 |

OTHER PUBLICATIONS

"International Application Serial No. PCT/US2008/006664 Search Report and Written Opinion mailed Apr. 15, 2009", 13 pages.

* cited by examiner

*Primary Examiner*—Robert Pascal
*Assistant Examiner*—Ryan J. Johnson
(74) *Attorney, Agent, or Firm*—Schwegman, Lundberg & Woessner P.A.

(57) ABSTRACT

An oscillator circuit for use in integrated circuits. The oscillator circuit includes a delay generation circuit having a current mirror with at least a first current mirror branch and a second current mirror branch, a current source coupled to the first current mirror branch, a capacitive element coupled to the first current mirror branch; and a resistive element coupled to the second current mirror branch. The oscillator circuit further includes a plurality of inverting elements coupled in series with one another and a transconducting element coupled to an output of the plurality of inverting elements. The transconducting element is configured to discharge the capacitive element. A latching element is coupled to latch to an output signal of the plurality of inverting elements.

21 Claims, 4 Drawing Sheets

LOW COST AND LOW VARIATION OSCILLATOR

TECHNICAL FIELD

The invention relates generally to an oscillator fabricated in integrated circuits. More specifically, the invention relates to an oscillator that produces an output frequency independent of transistor semiconductor processes, power supply variation, and biasing current.

BACKGROUND ART

Currently, the most common way to design an integrated oscillator is to use the ubiquitous ring oscillator circuit. As described below, the ring oscillator cell uses an odd number of CMOS inverters. However, a generated frequency of the typical ring oscillator circuit is strongly dependent not only upon the number of CMOS inverters used in the circuit, but upon a temperature of the integrated circuit itself.

In integrated circuit devices, the resistance of load devices is highly temperature sensitive. Variations in resistance are due primarily to changes in surface carrier mobility with temperature. However, integrated circuit capacitors are essentially temperature invariant. When a time constant generating circuit is constructed on an integrated circuit using a resistive load device and an ordinarily constructed integrated circuit capacitor, the RC time constant varies significantly with changes in temperature. The variation in the time constant based on temperature variation thus creates significant problems in stabilizing the oscillator frequency.

The conventional ring oscillator comprises an odd number of inverter stages serially connected in a ring. In a conventional CMOS transistor ring oscillator, each stage comprises a p-channel transistor and an n-channel transistor pair serially connected between first and second voltage potentials, typically a positive supply voltage and ground. The common terminal of the transistors is an output of the stage and is connected to gates of a subsequent transistor pair. Capacitive means shunts an output terminal to ground.

This circuit configuration makes the frequency of the oscillator dependent not only on the number of stages in the ring, but also on the supply voltage, $V_{CC}$, for the circuit. As $V_{CC}$ increases, the frequency of oscillation increases. Conversely, as $V_{CC}$ decreases, the frequency of oscillation decreases.

With reference to FIG. 1, a prior art ring oscillator circuit 100 includes a plurality of serially connected inverter circuits 101. Each of the plurality of inverter circuits 101 includes a CMOS transistor pair consisting of a PMOS transistor 103 serially connected to an NMOS transistor 105. Each of the plurality of inverter circuits 101 comprises one stage of the ring oscillator 100. To function, the ring oscillator circuit 100 always contains an odd number of stages. The odd number of stages insures an inherent instability of the ring oscillator circuit 100 whereby each of the stages sequentially change state. A capacitive means 107 is associated with the output of each stage. The capacitive means 107 shunts the output of each stage to ground and provides a delay in the changing of states between sequential stages.

With continued reference to FIG. 1, a skilled artisan immediately recognizes that an application of a "zero" (i.e., ground) to the input of one stage causes conduction of the PMOS transistor 103 in that stage. The conducting state of the PMOS transistor 103 charges the capacitive means 107 to a level of the supply voltage, $V_{CC}$. The charge on the capacitive means 107 thus provides a bias voltage for both the PMOS transistor 103 and the NMOS transistor 105 in the subsequent stage. In such an arrangement, the discharge of each capacitive means 107 through the NMOS transistor 105 of the preceding stage is dependent on the gate bias voltage, $V_{CC}$. Accordingly, a frequency of oscillation of the ring oscillator circuit 100 depends not only on the number of stages in the ring but also on the voltage level of the supply voltage $V_{CC}$. Consequently, as $V_{CC}$ increases in voltage, the frequency of oscillation increases. Conversely, when the voltage level of $V_{CC}$ decreases, the frequency of oscillation decreases due to the reduced discharge of each of the plurality of capacitive means 107.

The graph 200 of FIG. 2 indicates the relationship of frequency as a function of temperature. As temperature increases, the frequency decreases, thus illustrating the high temperature coefficient variation that can occur in integrated circuit oscillator devices.

Another prior art approach (not shown) utilizes a simple RC circuit in which a resistor and capacitor are connected in parallel. The capacitor is charged through the resistor until a specified threshold voltage is reached. When the threshold voltage is reached, the capacitor is discharged to a lower voltage threshold. The capacitor in such a circuit is frequently connected to a comparator in which a comparator output is used as an oscillator reference clock. Such a circuit still suffers from the drawbacks described with reference to FIG. 2.

In another prior art approach, shown with reference to FIG. 3, a bandgap reference-based oscillator circuit 300 includes a bandgap reference cell 301, a current reference source 303, a voltage comparator 305, and a capacitor 307. The bandgap reference cell 301 is known in the art to generate a voltage which has a very low temperature variation coefficient. In the bandgap reference-based oscillator circuit 300, the current reference source 303 generates a reference current. The current, in turn, linearly charges the capacitor 307. The voltage comparator 305 uses the bandgap reference cell 301 as a threshold reference. When a voltage level of the capacitor 307 reaches the bandgap voltage, the capacitor 307 is discharged and the charge/discharge sequence is repeated. The bandgap reference-based oscillator circuit 300 thus achieves a stable output frequency based upon the very low temperature variation coefficient of the bandgap reference cell 301 to generate voltages and currents. However, a major disadvantage of the bandgap reference-based oscillator circuit 300 is that it requires both significant power consumption and silicon area thereby driving up both the cost of fabrication and the cost of operation.

Therefore, what is needed is a simple and inexpensive oscillator circuit. The oscillator circuit will additionally have low power consumption, require little layout area, and not be dependent upon voltage and temperature variations. Such a circuit should be able to be readily integrated with other integrated circuit devices in a fabrication environment.

SUMMARY

In one exemplary embodiment, the invention is an oscillator circuit for use in integrated circuits. The oscillator circuit includes a delay generation circuit. The delay generation circuit includes a current mirror having at least a first current mirror branch and a second current mirror branch, a current source coupled to the first current mirror branch, a capacitive element coupled to the first current mirror branch; and a resistive element coupled to the second current mirror branch. The oscillator circuit further includes a plurality of inverting elements coupled in series with one another and a transconducting element coupled to an output of the plurality of inverting elements. The transconducting element is configured to discharge the capacitive element. A latching element is coupled to latch to an output signal of the plurality of inverting elements.

In another exemplary embodiment, the invention is an oscillator circuit for use in integrated circuits. The oscillator circuit includes a delay generation circuit. The delay generation circuit includes a current source and a first PMOS transistor coupled in series with the current source. The first PMOS transistor is coupled as a forward-biased diode. A second PMOS transistor is coupled in series with a first NMOS transistor. The first NMOS transistor is coupled as a forward-biased diode. A third PMOS transistor is coupled in series with a second NMOS transistor and each of the PMOS transistors is coupled to one another through respective gates on each PMOS transistor. A capacitive element is coupled in series with the first NMOS transistor and a resistive element is coupled in series with the second NMOS transistor. The first and second NMOS transistors are each coupled to one another through respective gates on each NMOS transistor. The oscillator circuit further includes a plurality of inverting elements coupled in series with one another and a transconducting element coupled to an output of the plurality of inverting elements. The transconducting element is configured to discharge the capacitive element. A latching element is coupled to latch to an output signal of the plurality of inverting elements.

In another exemplary embodiment, the invention is an oscillator circuit including a delay generation circuit. The delay generation circuit includes a current source, a first PMOS transistor coupled in series with the current source, a second PMOS transistor coupled in series with a first NMOS transistor, and a third PMOS transistor coupled in series with a second NMOS transistor. Each of the PMOS transistors is coupled to one another through respective gates on each PMOS transistor. A capacitive element is coupled in series with the first NMOS transistor and a resistive element is coupled in series with the second NMOS transistor. The first and second NMOS transistors are each coupled to one another through respective gates on each NMOS transistor. The oscillator circuit further includes a plurality of inverting elements coupled in series with one another and a transconducting element coupled to an output of the plurality of inverting elements. The transconducting element is configured to discharge the capacitive element.

DETAILED DESCRIPTION

In exemplary embodiments described herein, the invention is an oscillator comprised of a delay generation circuit which generates an output signal which propagates through a plurality of inverters coupled in series. The delay generation circuit utilizes two current mirror branches. The two current mirror branches each charge a capacitor and a resistor thus producing an RC time constant. A build-up of current through the resistor to a magnitude equal to the current mirror value produces a threshold voltage at an output of the delay generation circuit. The output of the delay generation circuit is fed to a first of the plurality of inverters in series. A final inverter in the series produces an output which clocks a D-type flip-flop. The D-type flip-flop is configured to toggle. An output of the D-type flip-flop produces a clock signal. The last inverter output is further coupled to a control input of a transistor to short-circuit the capacitor. Shorting the capacitor produces an output frequency independent of the transistor fabrication process, power supply variations, and current-mirror output current. Thus, the frequency variation is correlated with the variation in resistor and capacitor values.

Figure 1:
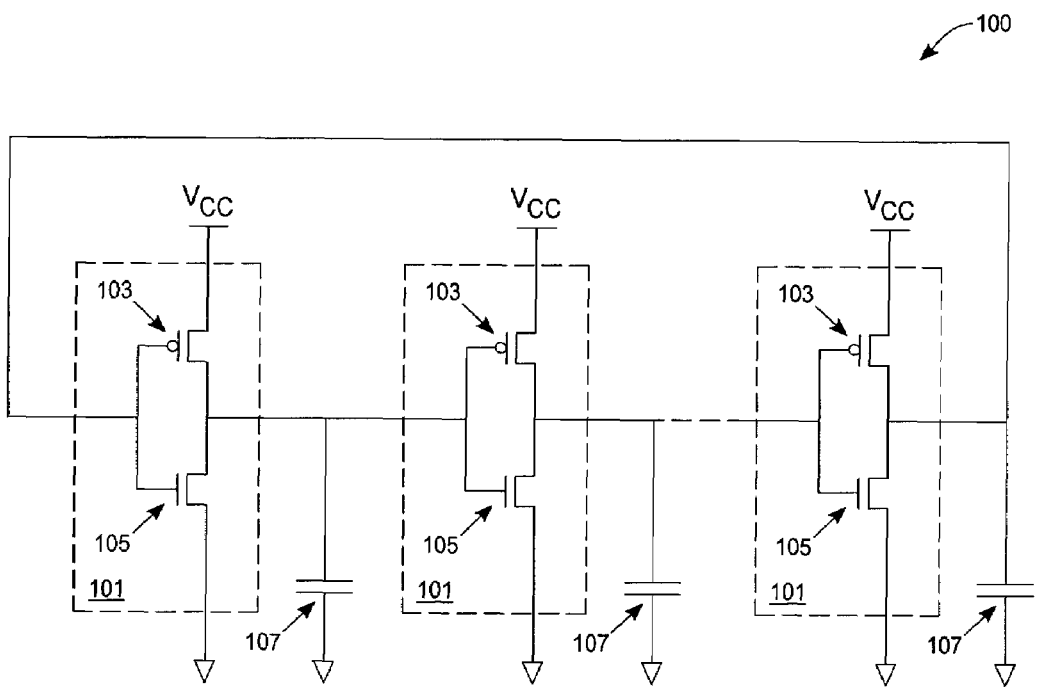
FIG. 1 shows a prior art ring oscillator circuit.
Figure 2:
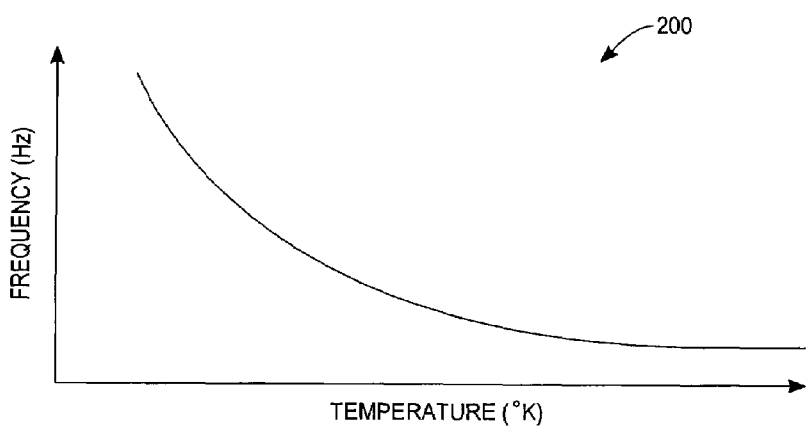
FIG. 2 shows a frequency temperature curve encountered in prior art circuits such as the ring oscillator circuit of FIG. 1.
Figure 3:
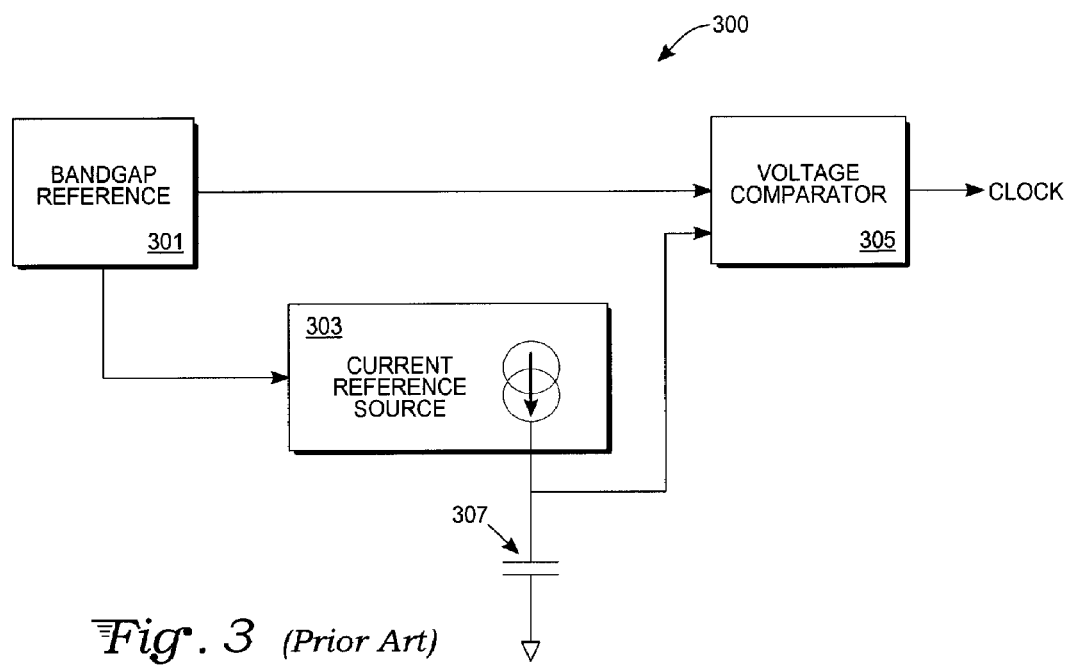
FIG. 3 is an oscillator circuit of the prior art incorporating a bandgap reference cell.
Figure 4:
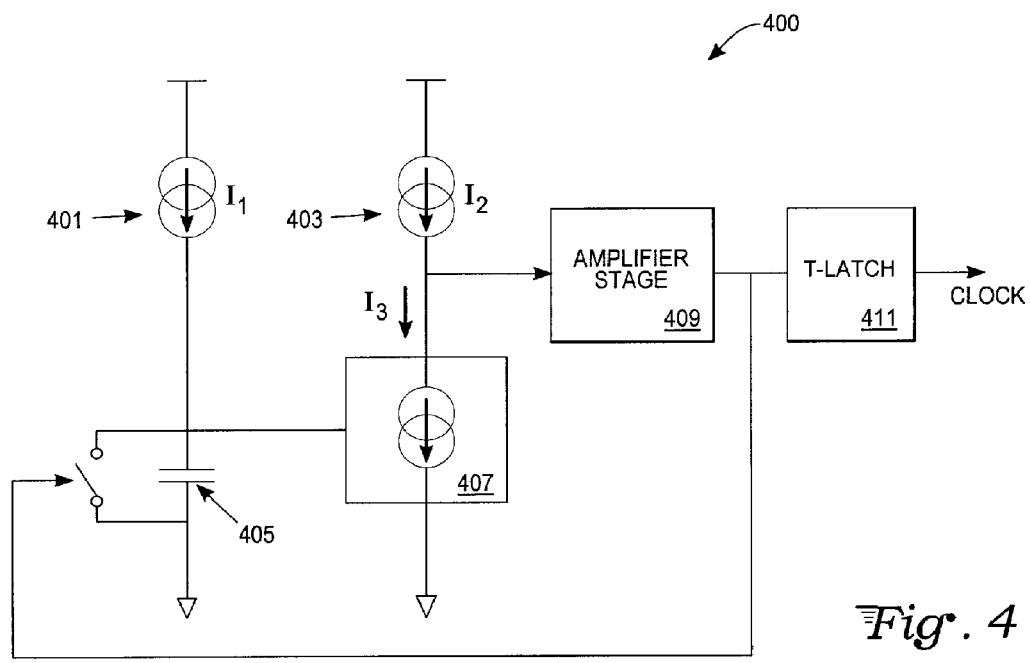
FIG. 4 is an exemplary representation of a current-mode oscillator of the present invention.

With reference to FIG. 4, an exemplary representation of a current-mode oscillator 400 includes a first current source 401 and a second current source 403. The first 401 and second 403 current sources are configured to operate as a current mirror. As is known in the art, a current mirror is a circuit designed to mirror a current through a first active device by controlling the current in a second active device of the circuit. Output current remains constant regardless of loading. The current-mode oscillator 400 further includes a capacitor 405, a voltage-to-current converter circuit 407, an amplifier stage 409, and a T-type latch 411.

An oscillation in the current-mode oscillator 400 is produced by integrating a constant current from the first current source 401 into the capacitor 405. The capacitor 405 integrates current $I_1$ produced by the first current source 401 and produces a voltage which increases linearly as a function of time. The voltage created in the capacitor 405 is converted to a current in the voltage-to-current converter circuit 407. The voltage-to-current converter circuit 407 thus allows comparison of the current produced therein with the initial current used to charge the capacitor 405. The current comparison is amplified in the amplifier stage 409 and a result from an output of the amplifier stage 409 is used to trigger a discharge in the capacitor 405 when the current produced in the voltage-to-current converter circuit 407 is equal to the value of the current $I_2$. The output from the amplifier stage 409 is toggled in the T-type latch 411.

Figure 5:
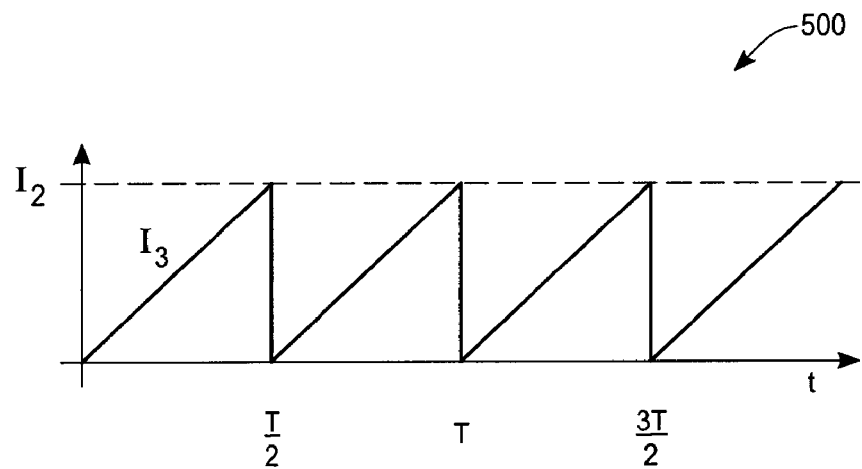
FIG. 5 is a graph of currents produced in the current-mode oscillator of FIG. 4.

With reference to FIG. 5 and continued reference to FIG. 4, a graph 500 of the output currents $I_2$ and $I_3$ from the current-mode oscillator 400 is displayed as a function of time (where T relates to the period of oscillation). For clarity in graphing, any switching delays are ignored; such delays are generally extremely small in comparison with the oscillating frequency. The oscillating frequency itself is determined by a capacitance value, C, of the capacitor 405 and by a gain, K, of the voltage-to-current converter circuit 407.

Thus, the slope of current $I_3$ is governed by $$I_{3,slope} = K \frac{I_1}{C}.$$

In a case where $I_1 = I_2$, then the oscillating frequency is not sensitive to the biasing current but only to $$I_1 = I_1\left(\frac{K}{C}\right)\left(\frac{T}{2}\right) = I_2$$

Eliminating the equivalent current terms provides $$\frac{T}{2} = \frac{C}{K} \Rightarrow T = 2\left(\frac{C}{K}\right)$$

Thus, the frequency of oscillation is strictly a function of K and C $$f = \frac{K}{2C}$$

Figure 6:
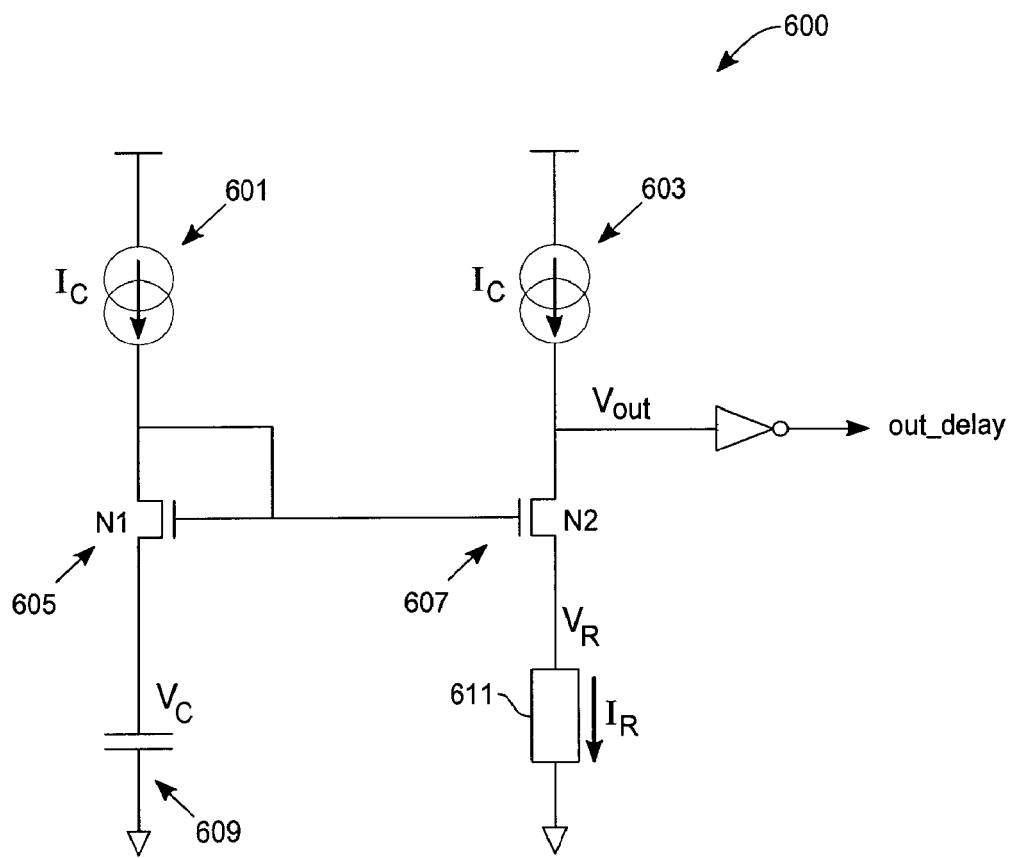
FIG. 6 is an exemplary embodiment of a delay generation circuit.

In FIG. 6, an exemplary delay generation circuit 600 includes a first current source 601 and a second current source 603, a first NMOS transistor 605 and a second NMOS transistor 607 with coupled gates, a capacitor 609, and a resistor 611. The first 605 and the second 607 NMOS transistors are generally fabricated as matching transistors (e.g., each transistor has a matching channel length and doping concentrations). The first NMOS transistor 605 is connected as a forward-biased diode.

In operation, the delay generation circuit 600 is independent of the current $I_C$ and is dependent entirely on values of the capacitance, C, of the capacitor 609 and the resistance, R, of the resistor 611 as is shown immediately below.

On operational start-up, the voltage, $V_C$, across the capacitor 609 is 0 volts. Due to the current $I_C$, the capacitor 609 loads such that $$V_C = \left(\frac{I_C}{C}\right) \cdot t$$

and $$V_R = V_C + V_{gs_{N1}} - V_{gs_{N2}}$$

The trip point occurs at the node $V_{out}$ when $I_C = I_R$ such that $V_{gs_{N1}} = V_{gs_{N2}}$ and $$I_C = \frac{V_R}{R} = \frac{V_C}{R}.$$

Thus, substituting variables at the trip point yields $$I_C = \left(\frac{I_C}{R \cdot C}\right) \cdot t \Rightarrow t = R \cdot C$$

Therefore, the delay, t, is entirely dependent only on the values of R and C.

Consequently, the delay generation circuit 600 produces a delay generated on out-delay which is independent of fabrication process parameters, power supply variations, and the bias current $I_C$. The delay is only correlated to the capacitor 609 and the resistor 611 variations.

Due to the dependency upon only R and C, the delay generation circuit 600 serves as a basis for a complete RC oscillator.

Figure 7:
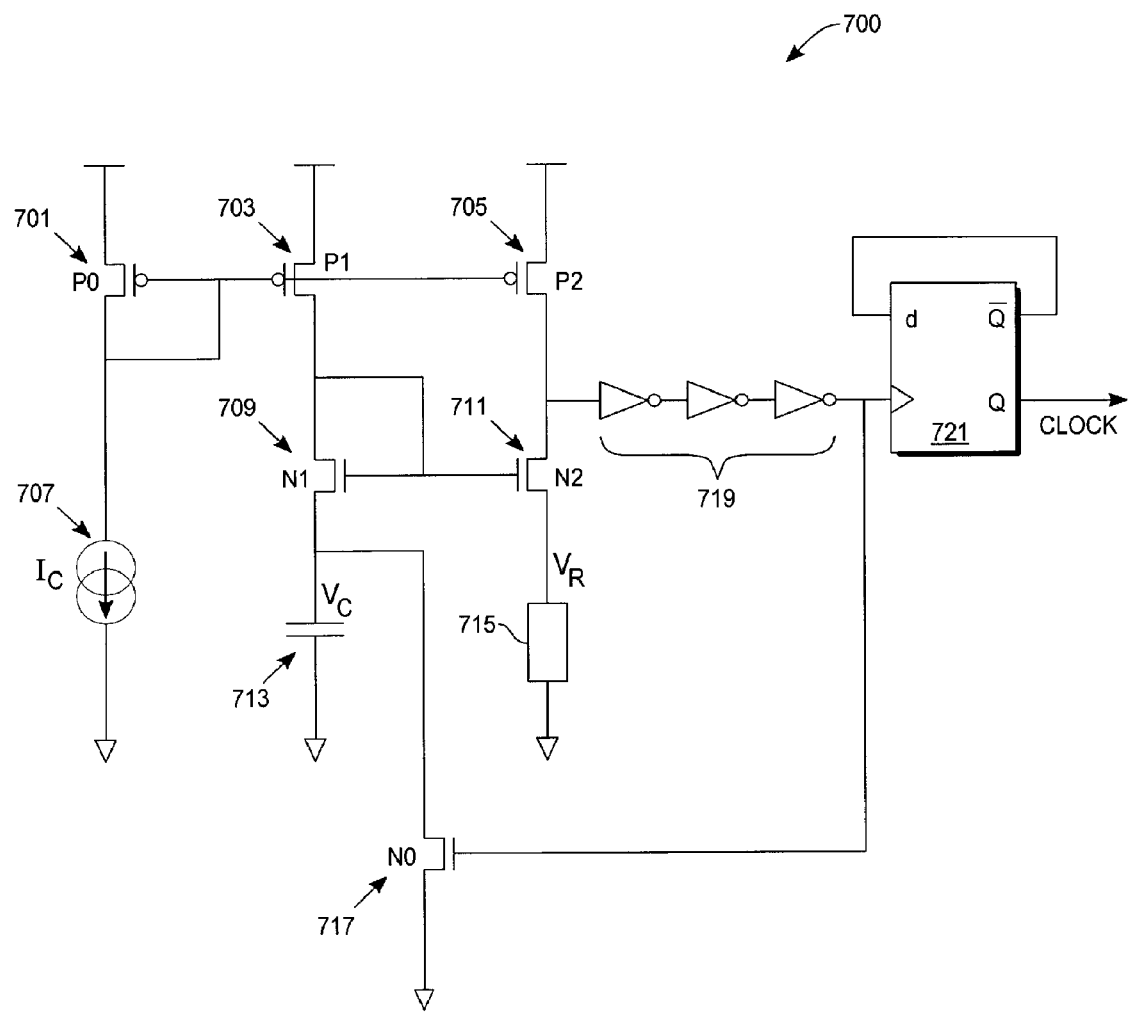
FIG. 7 is an exemplary embodiment of a low variation oscillator circuit employing concepts described in the exemplary delay generation circuit of FIG. 6.

In FIG. 7, an exemplary embodiment of a low variation oscillator 700 is based on the delay generation circuit 600 of FIG. 6. In the low variation oscillator 700, a structure similar to the delay generation circuit 600 is found in a combination of a first 703 and second 705 PMOS transistor pair, a first 709 and second 711 NMOS transistor pair, a capacitor 713, and a resistor 715. A third NMOS transistor 717 allows discharge of the capacitor 713 once a high logic signal is received from an output of a series of inverters 719. A D-type flip-flop 721 maintains a duty cycle of the low variation oscillator 700 at 50%. The D-type flip-flop 721 merely serves as a delay line or zero-order hold; data are posted at an output of the D-type flip-flop 721 one clock cycle after arriving at the input.

Current, $I_C$, produced by a current source 707 is copied due to a current mirror formed by the combination of a third PMOS transistor 701 in conjunction with the first 703 and second 705 PMOS transistors. A skilled artisan will recognize that the current $I_C$ may be generated with different bias circuits as well. For example, a classic bias may be produced utilizing transistor diodes. Significantly, any variation in the current $I_C$ is not critical since the period of an output CLOCK signal is uncorrelated with the amount of current produced.

The expression for the period of the low variation oscillator 700 is thus simply given as $T_{clk} = 2 \cdot RC + delay_{prop}$, where $delay_{prop}$ is a combined delay to propagation through the series of inverters and a finite discharge time of the capacitor 713. Where the propagation delay, $delay_{prop}$, is small with respect to 2RC such that $delay_{prop} << 2 \cdot RC$, the final result is expressed as $$T_{clk} \approx 2 \cdot RC$$

Thus, a period of the clock is strictly a function of the values of R and C only.

Simulation Results

The low variation oscillator 700 has been designed utilizing 0.13 μm design rules and yielded the following periods for variations in temperature, T, and supply voltage for worst case (WCS), nominal (NOM), and best case (BCS) measurements. Actual period measurements are displayed in TABLE 1.

TABLE 1

| Supply | T | | | | | | | | |
|---|---|---|---|---|---|---|---|---|---|
| | −40° C. | | | 25° C. | | | 100° C. | | |
| (V) | WCS | NOM | BCS | WCS | NOM | BCS | WCS | NOM | BCS |
| 1.08 | 51.2 | 49.5 | 49.4 | 50.7 | 49.2 | 48.9 | 50.3 | 48.9 | 48.4 |
| 1.20 | 49.2 | 49.1 | 49.3 | 49.1 | 48.6 | 48.7 | 48.8 | 48.3 | 48.3 |
| 1.32 | 48.8 | 49.0 | 49.5 | 48.5 | 48.5 | 48.8 | 48.2 | 48.1 | 48.3 |

From TABLE 1, a skilled artisan will appreciate that a period variation in the low variation oscillator 700 is less than 7% in all transistor corner processes including $V_{DD}$ and temperature variations. The total period variation is equivalent only to capacitor and resistor variations.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that various other types of transconducting elements may be used other than the CMOS-type devices listed herein. Further, other types of capacitive elements may be utilized other than a traditional capacitor design. The specification and drawings are, accordingly, to be regarded in an illustrative rather than a restrictive sense.

What is claimed is:

1. An oscillator circuit for use in integrated circuits, the oscillator circuit comprising:
 a current mirror having at least a first current mirror branch and a second current mirror branch, the current mirror comprising a first NMOS transistor and a second NMOS transistor, a gate of each of the first NMOS transistor and the second NMOS transistor being coupled to one another, the first NMOS transistor is coupled to act as a forward-biased diode;
 a current source coupled to the first current mirror branch;
 a capacitive element coupled coupled in series with the first NMOS transistor; and
 a resistive element coupled to the second current mirror branch;
 a plurality of inverting elements coupled in series with one another;
 a transconducting element coupled to an output of the plurality of inverting elements, the transconducting element configured to discharge the capacitive element; and
 a latching element, the latching element coupled to latch to an output signal of the plurality of inverting elements.

2. The oscillator circuit of claim 1 wherein the plurality of inverter elements is comprised of an odd number of inverter elements.

3. The oscillator circuit of claim 1 wherein the latching element is a D-type flip-flop configured to maintain a duty cycle of the oscillator circuit.

4. The oscillator circuit of claim 1 wherein the first and second NMOS transistors fabricated to be a matched pair of transistors.

5. The oscillator circuit of claim 4 wherein the second NMOS transistor is coupled in series with the resistive element.

6. The oscillator circuit of claim 1 wherein the circuit is configured such that an output clock period produced is a function of a resistive value of the resistive element and a capacitive value of the capacitive element.

7. An oscillator circuit for use in integrated circuits, the oscillator circuit comprising:
 a delay generation circuit having:
 a current mirror having at least a first current mirror branch and a second current mirror branch, the current mirror comprising a first NMOS transistor and a second NMOS transistor, a gate of each of the first NMOS transistor and the second NMOS transistor being coupled to one another, the first and second NMOS transistors fabricated to be a matched pair of transistors;
 a current source coupled to the first current mirror branch;
 a capacitive element coupled to the first current mirror branch; and
 a resistive element coupled to the second current mirror branch;
 a plurality of inverting elements coupled in series with one another;
 a transconducting element coupled to an output of the plurality of inverting elements, the transconducting element configured to discharge the capacitive element; and
 a latching element, the latching element coupled to latch to an output signal of the plurality of inverting elements,
 wherein the first NMOS transistor is coupled to act as a forward-biased diode, the first NMOS transistor being further coupled in series with the capacitive element.

8. An oscillator circuit for use in integrated circuits, the oscillator circuit comprising:
 a delay generation circuit having:
 a current source;
 a first PMOS transistor coupled in series with the current source, the first PMOS transistor further coupled as a forward-biased diode;
 a second PMOS transistor coupled in series with a first NMOS transistor, the first NMOS transistor further coupled as a forward-biased diode;
 a third PMOS transistor coupled in series with a second NMOS transistor, each of the PMOS transistors coupled to one another through respective gates on each PMOS transistor;
 a capacitive element coupled in series with the first NMOS transistor; and
 a resistive element coupled in series with the second NMOS transistor, the first and second NMOS transistors each coupled to one another through respective gates on each NMOS transistor;
 a plurality of inverting elements coupled in series with one another;
 a transconducting element coupled to an output of the plurality of inverting elements, the transconducting element configured to discharge the capacitive element; and
 a latching element, the latching element coupled to latch to an output signal of the plurality of inverting elements.

9. The oscillator circuit of claim 8 wherein the plurality of inverter elements is comprised of an odd number of inverter elements.

10. The oscillator circuit of claim 8 wherein an input to the plurality of inverting elements is coupled to a common node of the third PMOS transistor and the second NMOS transistor.

11. The oscillator circuit of claim 8 wherein the latching element is a D-type flip-flop configured to maintain a duty cycle of the oscillator circuit.

12. The oscillator circuit of claim 8 wherein the transconducting element is an NMOS transistor having a gate coupled to the output of the plurality of inverting elements.

13. The oscillator circuit of claim 8 wherein the circuit is configured such that an output clock period produced is a function of a resistive value of the resistive element and a capacitive value of the capacitive element.

14. An oscillator circuit comprising:
 a delay generation circuit having:
 a current source;
 a first PMOS transistor coupled in series with the current source;
 a second PMOS transistor coupled in series with a first NMOS transistor;
 a third PMOS transistor coupled in series with a second NMOS transistor, each of the PMOS transistors coupled to one another through respective gates on each PMOS transistor;
 a capacitive element coupled in series with the first NMOS transistor; and
 a resistive element coupled in series with the second NMOS transistor, the first and second NMOS transistors each coupled to one another through respective gates on each NMOS transistor;

a plurality of inverting elements coupled in series with one another; and a transconducting element coupled to an output of the plurality of inverting elements, the transconducting element configured to discharge the capacitive element.

15. The oscillator circuit of claim 14 wherein the plurality of inverter elements is comprised of an odd number of inverter elements.

16. The oscillator circuit of claim 14 wherein an input to the plurality of inverting elements is coupled to a common node of the third PMOS transistor and the second NMOS transistor.

17. The oscillator circuit of claim 14 further comprising a latching element coupled to latch to an output signal of the plurality of inverting elements.

18. The oscillator circuit of claim 17 wherein the latching element is a D-type flip-flop configured to maintain a duty cycle of the oscillator circuit.

19. The oscillator circuit of claim 14 wherein the transconducting element is an NMOS transistor having a gate coupled to the output of the plurality of inverting elements.

20. The oscillator circuit of claim 14 wherein the circuit is configured such that an output clock period produced is a function of a resistive value of the resistive element and a capacitive value of the capacitive element.

21. The oscillator circuit of claim 14 wherein the first PMOS transistor and the first NMOS transistor are each coupled to act as forward-biased diodes.

* * * * *